United States Patent [19]

Wudl et al.

[11] Patent Number: 5,189,136
[45] Date of Patent: Feb. 23, 1993

[54] CONDUCTING POLYMER FORMED OF POLY(2-METHOXY,5-(2′-ETHYL-HEXYLOXY)-P-PHENYLENEVINYLENE)

[75] Inventors: Fred Wudl, Santa Barbara; Gordana Srdanov, Goleta, both of Calif.

[73] Assignee: The Regents Of The University of California, Oakland, Calif.

[21] Appl. No.: 626,463

[22] Filed: Dec. 12, 1990

[51] Int. Cl.⁵ .............................................. C08G 61/02
[52] U.S. Cl. ....................................... 528/86; 252/500
[58] Field of Search ................... 528/86; 526/285, 313

[56] References Cited

U.S. PATENT DOCUMENTS 4,946,937  8/1990  Heitz .................................. 528/392

FOREIGN PATENT DOCUMENTS 1-234418  9/1989  Japan .

Primary Examiner—Christopher Henderson
Attorney, Agent, or Firm—George F. Bethel; Patience K. Bethel

[57] ABSTRACT

Poly(2-methoxy,5-(2′-ethyl-hexyloxy)-p-phenylenevinylene), MEH-PPV, useful as conductors or as sensors for halogens.

5 Claims, No Drawings

CONDUCTING POLYMER FORMED OF POLY(2-METHOXY,5-(2'-ETHYL-HEXYLOXY)-P-PHENYLENEVINYLENE)

This invention was made with Government support under contract No. F49620-88-C-0138 by the Air Force Office of Scientific Research. The Government has certain rights in this invention.

BACKGROUND OF THE INVENTION

Field of the Invention

This invention relates to the field of polymers and processes for their manufacture. More particularly, this invention relates to conjugated polymers including poly(phenylenevinylenes such as poly(2-methoxy,5-(2'-ethyl-hexyloxy)-p-phenylene vinylene), MEH-PPV, which are soluble in common organic solvents for fabrication of shaped articles such as fibers, tapes, rods and films and which are conducting polymers after oxidative doping.

Conducting polymers were discovered in the late 1970's which suggested the possibility of combining the important electronic and optical properties of semiconductors and metals with the attractive mechanical properties and processing advantages of polymers. Initial efforts to this end were discouraging since the new conducting polymers exhibited several undesirable properties including among others insolubility, intractability, relatively poor mechanical properties and moreover such polymers were non-melting.

More recently, specific conjugated polymers systems have been rendered more soluble and processable. For example, the poly(3-alkylthiophene) derivatives (P3ATs) of polythiophene are soluble and meltable with alkyl chains of sufficient length, and the P3ATs have been processed into films and fibers. See for example Hotta, S., et al, *Macromolecules*, 20:212 (1987); Nowak, M. et al. *Macromolecules*, 22:2917 (1989); Elsenbaumer, R. L., et al, *Synth. Met.* 15:169 (1986) and *Polym. Mat. Sci. Eng.* 53 79 (1985).: Hotta, S. et al, *Synth. Met.* 26:267 (1988). However, due to the moderate molecular weights and/or the molecular structures of these polymers, the mechanical properties, particularly the modulus and tensile strength of fibers and films made from these polymers are insufficient to enable their use in many applications.

Alternative methods of processing conductive polymers have been developed. For example, poly(-phenylenevinylene), PPV, and the alkoxy derivatives of PPV are synthesized via the precursor polymer route. See for example, Wessling, R. A. and Zimmerman, R. G., U.S. Pat. No. 3,401,152 (1968), U.S. Pat. No. 3,706,677 (1972); Gagnon, D. R. et al. *Am. Chem. Soc. Polym. Prepr.* 25:284 (1984); Momii et al. Chem Lett. (1987); Yamada et al. JCS Chem Commun (1987).

According to the precursor polymer route, a saturated precursor polymer is first synthesized. The precursor polymer is soluble and can be processed into the desired final shape. In the final step, the precursor polymer is thermally converted to the conjugated polymer.

Although the precursor polymer route is advantageous, the multi-step synthesis is complex making the resultant materials relatively expensive which thus limits their utility.

Other efforts have been directed to the development of p-polyphenylenevinylene, PPV, polymers which are soluble in the final conjugated form. Poly(dihexyloxy phenylenevinylene), DHO-PPV, is not soluble in common organic solvents at room temperature but is soluble at temperatures above 80° C. The longer side-chain octyloxy derivative, DOO-PPV, was found to be less soluble in most non-polar solvents, probably because of side chain interdigitation and "side chain crystallization".

Thus, until the present time the limited solubility and inferior mechanical properties of conjugated polymers suitable for oxidative doping has severely limited their use.

SUMMARY OF THE INVENTION

Accordingly, it is an object of the invention to provide a new composition of matter poly(2-methoxy,5-(2'-ethyl-hexyloxy)-p-phenylene vinylene), MEH-PPV, and related poly(phenylenevinylene) polymers.

It is another object of the invention to provide a process for the synthesis of poly(2-methoxy,5-(2'-ethyl-hexyloxy)-p-phenylene vinylene), MEH-PPV, and related poly(phenylenevinylene) polymers which are based on a precursor polymer route.

It is another object of the invention to provide a process for the synthesis of poly(2-methoxy,5-(2'-ethyl-hexyloxy)-p-phenylene vinylene), MEH-PPV, and related poly(phenylenevinylene) polymers which leads directly to this polymer in its final conjugated form.

It is another object of the invention to provide shaped articles such as fibers, tapes, films, and the like from solution processing or melt processing of poly(2-methoxy,5-(2'-ethyl-hexyloxy)-p-phenylene vinylene), MEH-PPV, and related poly(phenylenevinylene) polymers.

It is another object of the invention to provide shaped articles as above described which exhibit the varied color characteristics of conjugated polymers and which exhibit excellent mechanical properties.

It is another object of the invention to provide shaped articles as above described which are electrically conductive.

It is another object of the invention to provide a new composition of matter poly(2-methoxy,5-(2'-ethyl-hexyloxy)-p-phenylene vinylene), MEH-PPV, and related poly(phenylenevinylene) polymers which are readily soluble, at room temperature, in a variety of common organic solvents such as tetrahydrofuran, THF, chlorinated hydrocarbons and aromatic solvents.

It is another object of the invention to provide a new composition of matter poly(2-methoxy,5-(2'-ethyl-hexyloxy)-p-phenylene vinylene), MEH-PPV, and related poly(phenylenevinylene) polymers which form thixotropic solutions, for example after standing in benzene.

It is another object of the invention to provide a new composition of matter poly(2-methoxy,5-(2'-ethyl-hexyloxy)-p-phenylene vinylene), MEH-PPV, and related poly(phenylenevinylene) polymers which are conjugated backbone macromolecules which exhibit the typical attendant doping, electrochromic and semiconductor behaviors.

It is another object of the invention to provide a new composition of matter poly(2-methoxy,5-(2'-ethyl-hexyloxy)-p-phenylene vinylene), MEH-PPV, and related poly(phenylenevinylene) polymers which undergo doping at a much increased rate when compared to, for example, polyacetylene or the polythiophenes, and which exhibit a rapid undoping rate with iodine at room temperature.

It is another object of the invention to provide a new composition of matter poly(2-methoxy,5-(2'-ethyl-hexyloxy)-p-phenylene vinylene), MEH-PPV, and related poly(phenylenevinylene) polymers which when mixed with solvents form solutions which produce strong orange films when cast on glass from, for example, solutions with THF.

It is another object of the invention to provide a new composition of matter poly(2-methoxy,5-(2'-ethyl-hexyloxy)-p-phenylene vinylene), MEH-PPV, and related poly(phenylenevinylene) polymers which form solutions which form films which can be spin-cast on surfaces such as quartz, glass, and indium-tin oxide coated glass, ITO.

It is another object of the invention to provide a new composition of matter poly(2-methoxy,5-(2'-ethyl-hexyloxy)-p-phenylene vinylene), MEH-PPV, and related poly(phenylenevinylene) polymers which are useful in applications which include among others nonlinear optics, electrostatic shielding, electromagnetic interference shielding and, because of their speed in doping and dedoping, as sensors for the halogens, especially chlorine, bromine, and iodine.

DETAILED DESCRIPTION OF THE INVENTION

The polymers of the invention poly(2-methoxy,5-(2'-ethyl-hexyloxy)-p-phenylene vinylene), MEH-PPV, and related poly(phenylenevinylene) polymer compounds can be produced by one of two methods. These include an abbreviated synthesis which leads directly to the polymer and a precursor polymer route.

ABBREVIATED SYNTHESIS METHOD

The abbreviated synthesis method follows the following scheme 1:

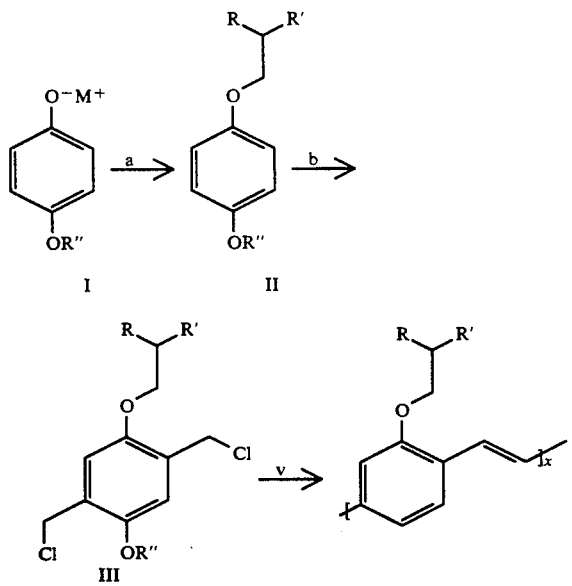

In the above formulations,
R is any alkane of 3-10 carbons;
R' is not equal to R and is any alkane, benzyl, or substituted benzyl group;
R" is any alkane having 1-10 carbons; and,
x is any number greater than about 20.

Examples of preferred compounds include among others:
R = —CH$_3$, —CH$_2$CH$_3$, —CH(CH$_3$)$_2$;
R' = —(CH$_2$)$_n$CH$_3$, —CH$_2$C$_6$H$_4$(CH$_2$)$_n$X where X is a group compatible with PPV polymerization such as —OCH$_3$, —CH=CH$_2$, —C≡CH; and n is any number greater than 1.
a, is YCH$_2$R'R where Y is the leaving group and R and R' are as above defined.

As used herein and in the appended claims, the term "leaving group" refers to a compound which is displaced and is more electronegative than carbon. Usually the leaving group comprises a halogen such as Cl, Br, I, sulfonic esters such as alkane sulfonate or p-toluenesulfonate.
a is in mixture with an alcohol, preferably methanol, or ethanol.
b is preferably formaldehyde in the presence of HCl.
c is t-BuOK, t-BuONa, t-BuOLi in the presence of tetrahydrofuran, THF.

The macromolecles which are the novel compounds of this invention have a poly(phenylenevinylene) backbone with specifically designed substituents to obtain the described properties. The preferred substituents are methoxy and a branched alkoxide.

It is the —CH$_2$R'R moiety which renders the polymers IV shown above a new composition of matter. Thus, the polymers IV can be homopolymers, copolymers, blends, and composites.

As noted above, the first step in forming the polymers of the invention according to the abbreviated synthesis method is to synthesize compound I, for example p-methoxy sodium phenoxide.

This can be done by any convenient method known to those skilled in the art. Generally, 4-alkoxy phenol is used as the starting material which is dissolved in a solvent such as an alcohol and refluxed with an alkali metal hydroxide to produce compound I.

The resulting solution is cooled to below 80° C. and preferably to room temperature and then mixed with compound a in the presence of a solvent, preferably an alcohol such as ethanol. The method of addition is not critical. This step is followed by refluxing until compound II is formed. This is usually accompanied by a color change.

The solvent is removed from compound II, for example by evaporation to produce a solid and an oily liquid. This mixture is washed several times with an alkali metal hydroxide and water. This step is followed by drying, for example over MgSO$_4$ and then removal of the solvent, for example by evaporation to produce a typically yellow oil of Compound II. This relatively crude compound II is then distilled under vacuum to produce a clear, viscous liquid.

Compound II is then dissolved in a solvent, for example p-dioxane and cooled to 0°-5° C. Concentrated HCl and aqueous formalin solution are added. Anhydrous HCl is then bubbled through the resulting solution and the reaction mixture allowed to warm to room temperature. The mixture is stirred for 1.5 to 2 hours.

Formalin is again added and anhydrous HCl bubbled through for 5-10 minutes at 0°-5° C. Stirring is continued for 1 hour and this step repeated 2-3 times after which the reaction mixture is stirred for 16 hours. At the end of this time the reaction mixture is refluxed for 3-4 hours.

The mixture is then cooled and the solvents removed to produce a typically "greasy" solid. This material is dissolved in a minimum amount of warm solvent, for example, warm hexanes and precipitated by adding an alcohol, for example, methanol until the solution becomes cloudy.

The resulting mixture is cooled, filtered, and washed with cold alcohol, such as methanol, to produce Compound III.

Compound III is dissolved in a solvent, preferably anhydrous THF. A solution of potassium tert-butoxide in anhydrous THF is then added dropwise with stirring at room temperature. It is critical to add the base to compound III in order to produce the desired soluble compound. If the solution of compound III is added to the base, an insoluble compound in the form of a gel of the same empirical formula is produced.

The resulting mixture is stirred at ambient temperature for 24 hours. At the end of this time the mixture is poured into an alcohol and stirred. This causes Compound IV to precipitate. The typically red-orange precipitate of Compound IV is washed with distilled water and reprecipitated from a THF/methanol mixture and dried under vacuum.

In the example which follows, the process steps are given for the specific preparation of poly(2-methoxy,5-(2'-ethyl-hexyloxy)-p-phenylene vinylene), MEH-PPV. It should be understood that the process steps are exemplary and are not intended to constitute a limitation of the invention.

For example, the process is not limited to the production of poly(2-methoxy,5-(2'-ethyl-hexyloxy)-p-phenylene vinylene), MEH-PPV. As noted above, various related poly(phenylenevinylene) polymers can be produced depending upon the identity of R, R', R", a, b, and c.

EXAMPLE 1

Step 1

Preparation of 1-Methoxy-4-(2-Ethyl-Hexyloxy)Benzene

A solution of 24.8 g (0.2 mole) of 4-methoxy phenol in 150 mL dry methanol was mixed under nitrogen with 1.5M solution of sodium methoxide (1.1 equivalent) and refluxed for 20 min. After cooling the reaction mixture to room temperature, a solution of 2-ethylbromohexane (42.5 mL, 1.1 equivalent) in 150 mL methanol was added dropwise.

After refluxing for 16 hours, the brownish solution turned light yellow. The methanol was evaporated and the remaining mixture of the white solid and yellow oil was combined with 200 mL of ether, washed several times with 10% aqueous sodium hydroxide, $H_2O$ and dried over $MgSO_4$. After the solvent was evaporated, 40 g (85%) of yellow oil was obtained.

The crude material was distilled under vacuum (2.2 mm Hg, b.p. 148°-149° C.), to give a clear, viscous liquid.

Analysis of the liquid gave the following results:

$^1H$ NMR ($CDCl_3$) delta 6.98 (4H, s, aromatics), 3.8 (5H, t,) —$OCH_2$, —O—$CH_3$), 0.7-1.7 (15H, m, $C_7H_{15}$). IR (NaCl plate) 750, 790, 825, 925, 1045, 1105, 1180, 1235, 1290, 1385, 1445, 1470, 1510, 1595, 1615, 1850, 2030, 2870, 2920, 2960, 3040. Anal. Calc. for $C_{15}H_{24}O_2$: C, 76.23; H, 10.23; O, 13.54. Found C, 76.38; H, 10.21; O, 13.45.

Step 2

Preparation of 2,5-bis(Chloromethyl)-1-Methoxy-4-(2-Ethyl-hexyloxy)Benzene

A solution of 4.9 g (20.7 mmoles) of the compound prepared in step 1 above was prepared by dissolving in 100 mL p-dioxane. The resulting solution was cooled down to 0°-5° C., and 18 mL of concentrated HCl, and 10 ml of 37% aqueous formalin solution was added.

Anhydrous HCl was bubbled through the solution for 30 minutes while the reaction mixture warmed up to room temperature. The mixture was then stirred for 1.5 to 2 hours. Another 10 mL of formalin solution was added and HCl gas bubbled for 5-10 minutes at 0°-5° C. After stirring at room temperature for 1 hour, this step was repeated 2-3 times, and the reaction mixture stirred at room temperature for 16 hours. At the end of this period, the reaction mixture was refluxed for 3-4 hours.

After cooling and removing the solvents, an off-white "greasy" solid was obtained. The material was dissolved in a minimum amount of warm hexanes and precipitated by adding methanol until the solution became cloudy. After cooling, filtering and washing with cold methanol, 3.4 g (52%) of white crystalline material (mp 52°-54° C.) was obtained.

Analysis produced the following results:

$^1H$ NMR ($CDCl_3$) delta 6.98 (2H, s, aromatics), 4.65 (4H, s, $CH_2$—Cl), 3.86 (5H, t, —O—$CH_3$, —O—$CH_2$), 0.9-1.5 (15H, m, $C_7H_{15}$). IR (KBr) 610, 700, 740, 875, 915, 1045, 1140, 1185, 1230, 1265, 1320, 1420, 1470, 1520, 1620, 1730, 2880, 2930, 2960, 3050. Anal Calc. for $C_{17}H_{26}O_2Cl_2$: C, 61.26; H, 7.86; O, 9.60; Cl, 21.27. Found: C, 61.31; H, 7.74; O, 9.72; Cl, 21.39.

Step 3, Polymerization

Preparation of Poly(1-Methoxy-4-(2-Ethylhexyloxy-2,5-phenylenevinylene), MEH-PPV.

A solution of 1.0 g (3mmol) of 2,5-bis(chloromethyl)-1-methoxy-4-(2-ethylhexyloxy)benzene prepared in step 2 above in 20 mL of anhydrous THF was prepared. To this was added dropwise a solution of 2.12 g (18 mmol) of 95% potassium tert-butoxide in 80 mL of anhydrous THF at room temperature with stirring. The reaction mixture was stirred at ambient temperature for 24 hours. At the end of this time the reaction mixture was poured into 500 mL of methanol with stirring. The resulting red precipitate was washed with distilled water and reprecipitated from THF/methanol and dried under vacuum to afford 0.35 g (45% yield).

Analysis of the product produced the following results:

UV ($CHCl_3$) 500. IR (film) 695, 850, 960, 1035, 1200, 1250, 1350, 1410, 1460, 1500, 2840, 2900, 2940, 3040. Anal. Calc. for $C_{17}H_{24}O_2$: C, 78.46, H, 9.23. Found: C, 78.34; H, 9.26.

Molecular weight (GPC vs polystyrene) $3 \times 10^5$. Inherent viscosity about 5 dl/g, but time dependent due to the tendency to form aggregates. The viscosity was found to increase with standing, particularly in benzene. The resulting solution was therefore thixotropic. The conjugated polymer is highly colored exhibiting a bright red-orange.

Maximum conductivity for non-stretched, $I_2$ doped films: 60 S/cm. Molecular weight (GPC vs polystyrene) $3 \times 10^5$.

SCHEME 2

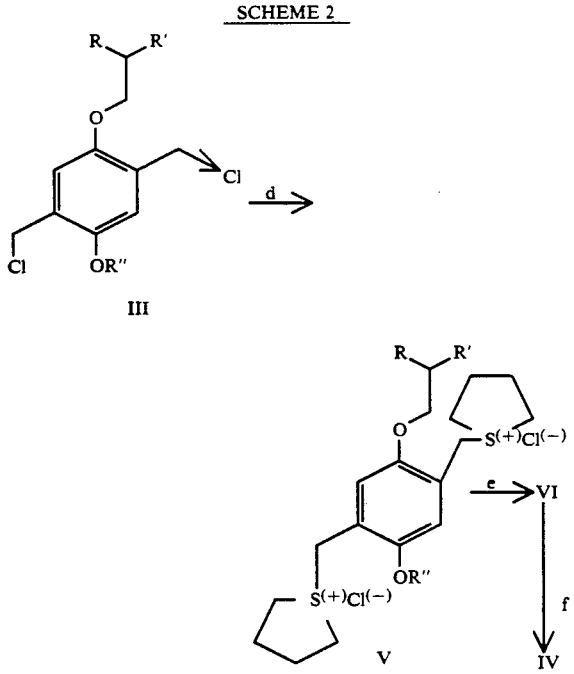

In the above Scheme 2:

R is any alkane of 3–10 carbons;

R' is not equal to R and is any alkane, benzyl, or substituted benzyl group;

R" is any alkane having 1–10 carbons; and, x is any number greater than about 20 (see Scheme 1 for structure of IV).

Examples of preferred compounds include among others R' = —$(CH_2)_nCH_3$, —$CH_2C_6H_4(CH_2)_nX$ where X is a group compatible with PPV polymerization such as —$OCH_3$, —$CH=CH_2$, —$C\equiv CH$ d = tetrahydrothiophene, THT, or any dialkysulfide in the presence of MeOH:

e = an alkali metal hydroxide in the presence of a hydroxylic solvent such as NaOH in MeOH;

f = Heat in the presence of 1,2,4-trichlorobenzene.

In the precursor polymer method, compound III can be synthesized in the same manner as described in the Direct Synthesis method. Compound III can then be reacted with tetrahydrothiophene or any dialkylsulfide at a temperature of from 0-about 60° C. for a time sufficient to produce compound V.

Alternately, in the Precursor Polymer Synthesis method, compound V can be prepared following the procedure described in standard literature procedures: for example, Wessling, R. A. and Zimmerman, R. G., U.S. Pat. No. 3,401152 (1968), U.S. Pat. No. 3,706,677 (1972); Gagnon, D. R. et al. Am. Chem. Soc. Polym. Prepr. 25: 284 (1984); Momii et al. Chem Lett. (1987); Yamada et al. JCS Chem Commun (1987).

The resulting compound V in solution is cooled to a low temperature, preferably less than 5° C. An alkali metal hydroxide in the presence of a hydroxylic solvent, such as methanol is added to neutralize the solution. This step produces a precipitate polymer, compound VI.

The polymer is separated out and dissolved in a solvent, preferably 1,2,4-trichlorobenzene and heated for a period of about 24 hours at a temperature above 200° C. and preferably at about 214° C. until compound IV is produced.

The following example is illustrative of the Precursor Polymer method and is not intended to constitute a limitation of the invention.

EXAMPLE 2

Step 1

Polymerization of the Precursor Polymer and Conversion to poly(2-methoxy,5-(2'-ethyl-hexyloxy)-p-phenylene vinylene), MEH-PPV, A solution of 200 mg (0.39 mmol) of compound V prepared according to known methods was formed with 1.2 mL dry methanol followed by cooling to 0° C. for 10 minutes. To the resulting cooled solution was slowly added a cold degassed solution of 28 mg (1.7 equivalents) of sodium hydroxide in 0.7 mL methanol.

After 10 minutes, the reaction mixture became yellow and viscous. The mixture was maintained at 0° C. for another 2–3 hours and then the solution was neutralized. A very thick, gum-like material was transferred into a Spectrapore membrane (MW cutoff 12,000–14,000) and dialysed for 3 days in degassed methanol containing 1% water in order to remove low molecular weight products, sodium chloride and reactants.

After drying in vacuo, 70 mg (47%) of "plastic" yellow precursor polymer material was obtained.

Analysis of this product yielded the following: UV (CHCl$_3$) 365. IR (film) 740, 805, 870, 1045, 1075, 1100, 1125, 1210, 1270, 1420, 1470, 1510, 2930, 2970, 3020. The product was soluble in $C_6H_5Cl$, $C_6H_3Cl_3$, $CH_2Cl_2$, CHCl$_3$, Et$_2$O, THF and was insoluble in MeOH.

Step 3

Conversion of the Precursor Polymer to the Conjugated poly(2-methoxy,5-(2'-ethyl-hexyloxy)-p-phenylene vinylene), MEH-PPV, The precursor polymer was converted to the conjugated poly(2-methoxy,5-(2'-ethyl-hexyloxy)-p-phenylene vinylene), MEH-PPV, according to step e of Scheme 2 by heating to reflux (approximately 214° C.) in 1,2,4-trichlorobenzene solvent. The product was identical with the material obtained by the abbreviated synthesis route described in Example 1 above.

EXAMPLE 3

Solubility of the Conjugated Polymer, poly(2methoxy,5-(2'-ethyl-hexyloxy)-p-phenylene vinylene), MEH-PPV.

The processing properties were found to be remarkable in that poly(2-methoxy,5-(2'-ethyl-hexyloxy)-p-phenylene vinylene), MEH-PPV, was found to be fully soluble in common organic solvents. For example, 1% wt/wt (or below) solutions of MEH-PPV were readily made by dissolving the polymer prepared in Examples 1 and 2 above in xylene at room temperature or at elevated temperatures.

Higher concentration of MEH-PPV, e.g. 2% wt/wt could be readily dissolved at elevated temperatures, but resulted in the formation of a gel after cooling down to room temperature. MEH-PPV was found to dissolve equally well in THF, in chlorinated hydrocarbons and aromatic solvents, such as xylene, toluene, and chlorobenzene.

The MEH-PPV solutions are highly colored (orange-red).

MEH-PPV was cast from solution in THF and a variety of other solvents onto glass by drop-casting or by spin casting to produce strong red-orange films. Films were also spin-cast on surfaces such as quartz, glass, and ITO glass (indium-tin oxide coated glass). The films appeared to be both smooth and uniform.

EXAMPLE 4

Doping and Electronic Properties

MEH-PPV is typical of conjugated backbone macromolecules with all of the attendant properties, including doping, electrochromic and semiconductor behavior. Moreover, MEH-PPV undergoes doping at a rapid rate as compared to, for example, polyacetylene or the polythiophenes.

The MEH-PPV polymer in solution prepared according to Example 3 above was cast into a free standing film. The film was exposed to iodine vapor. During the period of exposure, the conductivity rose from an initial value of $10^{-8}$ S/cm to a value of 1 S/cm in approximately 15 minutes.

The undoping rate with iodine is also rapid at room temperature. The maximum (saturation doping) conductivity for nonstretched, $I_2$ doped films was 60 S/cm as measured by the standard four probe method.

Doping with $FeCl_3$ also resulted in high conductivity, in excess of 10 S/cm.

The color change on doping, characteristic of conducting polymers, was observed. In the doped conducting form, the MEH-PPV appeared dark black.

EXAMPLE 5

Thermal Properties: High Temperature Stability

Thermogravimetric analysis (TGA) was carried out on MEH-PPV. The onset of degradation was observed at 340° C. Differential Scanning Calorimetry (DSC) scans were flat below 340° C.

Production of a Gel Polymer

By following the procedure of the direct synthesis method to compound III, a new composition of matter, compound IV', can be made which is chemically the same as compound IV but which exhibits different properties.

This is accomplished by adding the t-BuOK, or equivalent in THF all at once to the solution of compound III in THF. The product, compound IV', exhibits different properties from compound IV. Specifically, compound IV' is hard and flexible and insoluble compared with compound IV. The strength of this gel polymer IV' makes it useful in applications where strength is a desirable factor.

The following Example illustrates the preparation of compound VII and is not intended to limited the invention.

EXAMPLE 6

Preparation of IV' Gel Polymer

To a solution of 120 mL (0.3 M) of t-BuOK in THF was added, all at once, a solution of 2.0 g (6mmol) of compound III, 2,5-bis(chloromethyl)-1-methoxy-4-(2-ethylhexyloxy)benzene prepared following the procedure in Example 1, step 2 above in 20 mL of anhydrous THF.

The reaction mixture was stirred for 16 hours and the soluble parts removed by filtration. The gel product, compound IV', poly(2-methoxy,5-(2'-ethylhexyloxy)-p-phenylene vinylene), MEH-PPV, was washed alternately with methanol and THF three times, and dried under Vacuum to yield 1.1 g (69%).

Solid State $^{13}C$ NMR spectrum and IR spectrum were identical with the soluble polymer IV, poly(2-methoxy,5-(2'-ethyl-hexyloxy)-p-phenylene vinylene), MEH-PPV, prepared according to the procedure of Example 1.

Analysis calculated for $C_{17}H_{24}O_2$: C, 78.41; H, 9.29. Found: C, 78.32; H, 9.33.

The above example shows the importance of the method of addition of the reactants in the method. To form the soluble compound IV, the t-BuOK or equivalent in THF must be added to the solution of compound III.

When the reverse procedure is followed, that is, the solution of compound III is added to the t-BuOK in THF, an insoluble, gel product, compound IV' is formed which exhibits different properties from compound IV although it is chemically identical. This is thought to be due to crosslinking.

EXAMPLE 7

Properties of Gel Polymer IV'

The product of Example 6 is rolled into a film and portions exposed separately to $I_2$, $Br_2$, and $Cl_2$. The resulting doped films are shown to conduct electricity.

EXAMPLE 8

Use of poly(2-methoxy,5-(2'-ethyl-hexyloxy)-p-phenylene vinylene, MEH-PPV, as a Sensor for Halogens A free standing film prepared according to the procedure of Example 4 is placed in an atmosphere known to contain iodine. After a period of seconds-minutes exposure, the conductivity is measured to correlate with the amount of Iodine in the atmosphere.

After measurement of the Iodine uptake, the film is heated to drive off the Iodine for reuse as a sensor.

Substantially the same results are obtained using bromine and chlorine as the halogen to be sensed.

The invention thus described provides a new composition of matter, compound IV, characterized by its solubility in common solvents at room temperature, its fast doping and dedoping properties, its ability to form thixotropic solutions, and its desirable electrochromic and semiconductor properties. Novel shaped articles including among others fibers, tapes, films and the like can be made from solution or melt processing of compound IV as well as strong organic films when cast on glass. Novel methods for the production of compound IV are also provided including a direct abbreviated polymer synthesis and a precursor polymer synthesis method.

The invention further provides a method for producing compound IV' in the form of gel compound which is characterized by the same chemical formula as compound IV and which exhibits the same doping and dedoping characteristics, coupled with desirable mechanical strength properties. Compound IV, is also hard and flexible.

Various modifications of the invention are contemplated and can be resorted to by those skilled in the art without departing from the spirit and scope of the invention as defined in the following claims.

We claim:

1. A poly(phenylenevinylene) polymer comprising: poly(2-methoxy,5-(2'-ethyl-hexyloxy)-p-phenylenevinylene).

2. A film cast from a solvent solution of the polymer of claim 1.

3. A fiber formed of the polymer of claim 1.

4. A molded article formed of the polymer of claim 1.

5. A film on a surface formed from the polymer of claim 1.

* * * * *